(12) United States Patent
Ueki et al.

(10) Patent No.: US 6,317,322 B1
(45) Date of Patent: Nov. 13, 2001

(54) PLATE TYPE HEAT PIPE AND A COOLING SYSTEM USING SAME

(75) Inventors: Tatsuhiko Ueki; Masaaki Yamamoto; Masami Ikeda, all of Tokyo (JP)

(73) Assignee: The Furukawa Electric Co., Ltd. (JP)

( * ) Notice: Subject to any disclaimer, the term of this patent is extended or adjusted under 35 U.S.C. 154(b) by 0 days.

(21) Appl. No.: 09/640,460

(22) Filed: Aug. 15, 2000

(51) Int. Cl.[7] ........................................ H05K 7/20
(52) U.S. Cl. .................. 361/700; 361/695; 361/698; 361/699; 361/719; 257/714; 257/715; 257/722; 174/15.2; 174/16.3; 165/80.3; 165/80.4
(58) Field of Search ..................... 361/689, 694, 361/695, 698, 699, 700, 702, 704, 709–711; 257/714, 715; 174/15.1, 15.2, 16.1, 16.3; 165/80.3, 80.4, 104.33, 185

(56) References Cited

U.S. PATENT DOCUMENTS

| | | | |
|---|---|---|---|
| 4,685,512 | * 8/1987 | Edelstein et al. | 165/104 |
| 5,453,911 | * 9/1995 | Wolgemuth et al. | 361/689 |
| 5,642,775 | * 7/1997 | Akachi et al. | 165/104.14 |
| 5,704,416 | * 1/1998 | Larson et al. | 165/104.33 |
| 5,761,037 | * 6/1998 | Anderson et al. | 361/700 |

FOREIGN PATENT DOCUMENTS

411063862-A * 3/1999 (JP).

\* cited by examiner

*Primary Examiner*—Leo P. Picard
*Assistant Examiner*—Boris L. Chervinsky
(74) *Attorney, Agent, or Firm*—Knobbe, Martens, Olson & Bear, LLP.

(57) ABSTRACT

A plate type heat pipe having a hermetically sealed container installed so as to face a printed board on which at least one part to be cooled is mounted, wherein a block which passes through at least one main surface portion of the container is arranged within the container in a corresponding portion to the part(s) to be cooled.

18 Claims, 7 Drawing Sheets

PLATE TYPE HEAT PIPE AND A COOLING SYSTEM USING SAME

BACKGROUND OF THE INVENTION

1. Field of the Invention

The present invention relates to a plate type heat pipe and a cooling system using same for cooling parts to be cooled such as semiconductor chip or the like mounted on a printed board.

2. Description of the Related Art

Electronic parts such as semiconductor chips or the like generate heat to some extent, when used, which are mounted on various devices such as personal computers and electric or electronic devices such as power equipment. The function of the electronic parts deteriorates and the life time thereof is shortened, when the electronic parts are over heated, thus the cooling of the electronic parts becomes an important technical issue. There are known cooling methods for cooling heat generating parts which require cooling, for example, which takes in a cool air from outside and removes a hot air within a box receiving heat generating parts by means of a fan, or which cools heat generating parts by attaching a heat transfer block (i.e., cooling body) to transfer heat from the heat generating parts to the heat transfer block.

As the heat transfer block, there may be used metallic material such as copper or aluminum which has high heat transfer property, or ceramics material such as carbon, or aluminum nitride which has excellent heat transfer property. In addition, a heat pipe may be used instead of the heat transfer block.

FIG. 9 shows a cross sectional view of a conventional plate type heat pipe which is applied to cool heat generating parts. As shown in FIG. 9, the plate type heat pipe 7 is installed in such manner that one plate member thereof faces heat generating parts 52 mounted on a printed board 54. The heat generating parts 52 are thermally contacted with the plate member of the plate type heat pipe 7. The heat pipe 7 receives heat from the heat generating parts 52 to cool heat generating parts 52. In the example shown in FIG. 9, a heat dissipating fin 51 is further attached on the other plate member of the plate type heat pipe 7 to further improve heat dissipation from the plate type heat pipe 7 to outside. Reference numeral 53 is a lead (frame) of the heat generating parts (in semiconductor chip). Reference numerals 50 and 501 are a container and a hollow portion of the plate type heat pipe 7, respectively. Working fluid and the like within the hollow portion 501 are not shown in FIG. 9.

The heat pipe is briefly described hereunder. In general, the heat pipe includes a hermetically sealed hollow portion and working fluid received therein. The heat is transferred by the phase transition and movement of the working fluid received within the hollow portion. The inner pressure of the hollow portion is reduced so as to accelerate the phase transition of the working fluid.

When heat is applied to a part (which is often called as a heat absorbing side or portion) of the container forming the heat pipe, the heat is transferred to the working fluid staying in the corresponding portion to the part of the container within the hollow portion to cause the working fluid to evaporate. The evaporated working fluid moves within the hollow portion to a portion (which is often called as a heat dissipating side or portion) in which the evaporated working fluid is cooled to return to a liquid phase, for example the portion to which the heat dissipating fin is attached. The working fluid returned to the liquid phase moves back to the heat absorbing side of the container (i.e., circulation). The heat is thus transferred by the phase transition and movement of the working fluid.

In order to secure the continuous circulation of the working fluid, the heat pipe is placed in such manner that the heat absorbing side is positioned below the heat dissipating side. When placed as described above, the working fluid returned to the liquid phase moves back by the function of gravity. However, the electric or electronic devices such as a note book type personal computer, for example, are sometimes largely inclined or positioned in reverse, when used. The circulation of the working fluid by the function of gravity may not be expected in the above-mentioned situation.

A wick to perform capillary action is installed within the hollow portion of the heat pipe to supplement the function of the heat pipe in the above-mentioned situation. The wick includes a metallic mesh and a metallic wire, and fine grooves are formed in the inner wall of the container to perform the capillary action.

As material for the container of the heat pipe, there are often used material of aluminum, copper and stainless steel and the like. A whole body of the container is not necessarily formed by the same material. In addition to water, substituted Freon or alcohol is used as the working fluid.

In the cooling system of the embodiment as shown in FIG. 9, it is important to contact the plate type heat pipe 7 with the heat generating part 52 (for example, semiconductor chip) which is to be cooled in least heat resistance, in order to accomplish the effective cooling.

When a plurality of heat generating parts to be cooled are mounted on the printed board, the heights of the heat generating parts are different each other in many cases since different kinds of heat generating parts are often mounted. In those situation, it is not easy to cause the plate type heat pipe 7 as shown in FIG. 9 to contact with the heat generating parts. Accordingly, the present inventors invented the plate type heat pipe having protruding portions corresponding to the heights of the heat generating parts to be cooled and filed a patent application directed thereto. As shown in FIG. 10, the heat generating part 62 and the heat generating part 620 have different heights from the printed board 64. According to the plate type heat pipe 8, the heat generating parts 62, 640 having different heights can be effectively cooled. Furthermore, a space for placing wiring is often required between the adjacent heat generating parts 62, 640. According to the plate type heat pipe 8 as shown in FIG. 10, the above-mentioned space can be obtained. Reference numerals 60, 601 show the container, and the hollow portion, respectively. Reference numeral 61 shows the heat dissipating fin, and reference numerals 63, 64 show the lead (frame) and the printed board respectively.

When the cooling systems as shown in FIGS. 9 and 10 are used, it is necessary to have highly preciseness in size to cause the plate type heat pipe to contact with the heat generating parts to be cooled in least heat resistance, even though a heat transfer grease is placed therebetween. More specifically, there are required the preciseness in size of the portion of the plate type heat pipe 7, 8 corresponding to the heights of the heat generating parts 52, 62, as well as flatness of the contact surface thereof. For example, such preciseness as being up to 0.01 mm is often required in relation to the heights of the respective protruding portions of the plate type heat pipe 8.

The thickness of the plate member of the container 50, 60 forming the plate type heat pipe 7, 8 is preferably smaller as far as possible from the point of heat transfer property. Since the size of the printed board 54, 64 is about several cm x several cm in area, the size of most of the plate type heat pipe is often the same as those of the printed board. The thickness of the plate member of the container 50, 60 of those heat pipe 7, 8 is up to 1 mm which is sufficient in strength (when copper plate material is used for the container). More specifically, the thickness of the plate member of the container 50, 60 forming the plate type heat pipe 7, 8 is very small (i.e., thin) in general.

However, when the container 50, 60 having such thin plate member as described above is applied, it is very difficult in cost to realize the highly preciseness in the plate type heat pipe 7, 8 (i.e., expensive). Because the thin material has inclination to be easily deformed, in addition, it is difficult to prevent the container 50, 60 from being deformed by heat according to workings such as welding or the like when the container is fabricated. In addition, the container fabricated by the thin plate material has inclination to be deformed by the raised inner pressure caused together with vaporization of the working fluid.

An object of the present invention is therefore to provide a plate type heat pipe which may contact with the heat generating parts to be cooled in least resistance and enable effective cooling of the heat generating parts, and the cooling system using same.

SUMMARY OF THE INVENTION

To solve the above-mentioned problems in the conventional art, the present inventors have been studying hard. As a result, the present inventors have invented a plate type heat pipe which may contact with the heat generating parts to be cooled in least resistance and enable effective cooling of the heat generating parts, and the cooling system using same.

The first embodiment of a plate type heat pipe of the invention comprises a plate type heat pipe having a hermetically sealed container installed so as to face a printed board on which at least one part to be cooled is mounted, wherein at least one block which passes through at least one main surface portion of said container is arranged within said container in a corresponding portion to said part to be cooled.

The second embodiment of a plate type heat pipe of the invention comprises a plate type heat pipe as described above, wherein said block passes through said main surface portion which faces said part to be cooled.

The third embodiment of a plate type heat pipe of the invention comprises a plate type heat pipe as described above, wherein a tip portion of said block which passes through said main surface portion extends along outer surface of said main surface portion.

The fourth embodiment of a plate type heat pipe of the invention comprises a plate type heat pipe as described above, wherein said block is integrally formed as one piece together with one of said main surface portion by a same material.

The fifth embodiment of a plate type heat pipe of the invention comprises a plate type heat pipe as described above, wherein a wall portion is formed in a portion corresponding to side surface of said block within a hollow portion of said container in such manner that said container is hermetically sealed and said block is separated from said working liquid received in said container.

The sixth embodiment of a plate type heat pipe of the invention comprises a plate type heat pipe having a hermetically sealed container including an upper plate member and a lower plate member installed so as to face a printed board on which at least one part to be cooled is mounted, wherein an opening portion is formed in said lower plate member, and at least one block is arranged within said container in such manner that one end of said block is joined on inner surface of said upper plate member, and other end of said block passes through said opening portion and extends to a prescribed length toward said part to be cooled.

The seventh embodiment of a plate type heat pipe of the invention comprises a plate type heat pipe having a hermetically sealed container including an upper plate member and a lower plate member installed so as to face a printed board on which at least one part to be cooled is mounted, wherein an opening portion is formed in said lower plate member which faces said part to be cooled, another opening portion is formed in said upper plate member, and at least one block is arranged within said container in such manner that one end of said block passes through said another opening portion in said upper plate member so as to form a same plane together with outer surface of said upper plate member, and other end of said block passes through said opening portion and extends to a prescribed length toward said part to be cooled.

The eighth embodiment of a plate type heat pipe of the invention comprises a plate type heat pipe having a hermetically sealed container including an upper plate member and a lower plate member installed so as to face a printed board on which at least one part to be cooled is mounted, wherein at least one though hole is formed from said upper plate member to said lower plate member, side surface of said through hole is defined by wall member so as for said container to be hermetically sealed, and a block is arranged in close contact within respective said through hole in such manner that one end of said block forms a same plane together with outer surface of said upper plate member, and other end of said block extends from outer surface of said lower plate member to a prescribed length toward said part to be cooled.

The first embodiment of a cooling system comprises a cooling system using said plate type heat pipe defined above installed so as to face a printed board on which at least one part to be cooled is mounted, said part to be cooled being connected to said plate type heat pipe, and a heat sink joined on said plate type heat pipe.

The second embodiment of a cooling system comprises a cooling system using said plate type heat pipe defined above with a fan to supply air to said heat sink further included.

DETAILED DESCRIPTION OF THE PREFERABLE EMBODIMENTS

According to the present invention, there is provided a plate type heat pipe having a hermetically sealed container installed so as to face a printed board on which at least one part to be cooled is mounted, wherein at least one block which passes through at least one main surface portion of the container is arranged within the container in a corresponding portion to the part to be cooled.

Accordingly, a part of the upper surface of the block may comprises a part of one of the main surfaces. Furthermore, the block passes through the main surface portion which faces the part to be cooled. The block further extends downward through the main surface portion which faces the part to be cooled.

The block may be integrally formed as one piece together with one of the main surface portion by the same material. Wall portion is formed in a portion corresponding to side surface of the block within a hollow portion of the container in such manner that the container is hermetically sealed and the block is separated from the working liquid received in the containe.

According to the present invention, there is provided a cooling system using the plate type heat pipe as described above installed so as to face a printed board on which at least one part to be cooled is mounted, the part to be cooled being connected to the plate type heat pipe, and a heat sink jointed on the plate type heat pipe. A fan to supply air to the heat sink may be further included.

With reference to the accompanying drawings, there are described a plate type heat pipe and a cooling system using same according to the present invention.

Figure 1:
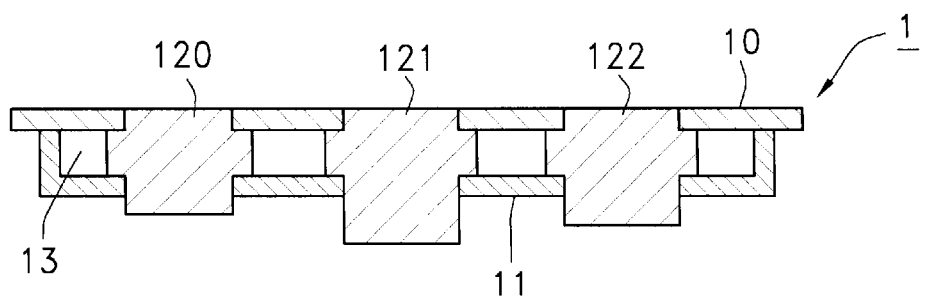
FIG. 1 is a schematic cross sectional view of one embodiment of a plate type heat pipe of the present invention.

FIG. 1 is a schematic cross sectional view of one embodiment of a plate type heat pipe of the present invention. There are arranged blocks 120 to 122 which pass through both of main surfaces (i.e., upper and lower surfaces in the drawing) formed by an upper plate member and a lower plate member in a plate type heat pipe 1. More specifically, the respective upper ends of the blocks are fitted into opening portions formed in the upper plate member in such manner that the upper surface of the plate member is positioned in the same plane to the respective upper surfaces of the blocks, as shown in FIG. 1. The main body of the blocks are vertically arranged to run through the plate type heat pipe. The lower end of the blocks pass through the lower plate member and protrude downward a prescribed length. The above-mentioned length is decided in corresponding to the height of the part to be cooled mounted on a printed board.

The blocks 120 to 122 are made of solid material. The parts to be cooled (not shown) are caused to contact with the lower surfaces of the blocks 120 to 122 described in FIG. 1. Heat transfer grease may be placed therebetween.

The blocks 120 to 122 are joined to the upper plate member 10 and the lower plate member 11 in such manner as described above to form a hermetically sealed hollow portion 13 within the container. Working fluid (not shown) is received in the hollow portion 13. Wick or the like (not shown) to perform a capillary action may be arranged within the hollow portion 13. As a material of the blocks 120 to 122, metallic material having excellent heat transfer property, ceramics such as graphite, aluminum nitride or the like, and composite material thereof may be used, but not limited thereto.

Heat generated by the heat generating part which is contacted with the lower surface of the block is rapidly transferred through the block having excellent heat transfer property to the side of the upper plate member. Furthermore, the heat transferred to the block causes the working fluid received in the hollow portion to be vaporized and flowed to the side of the upper plate member according to the function of the heat pipe.

Figure 2:
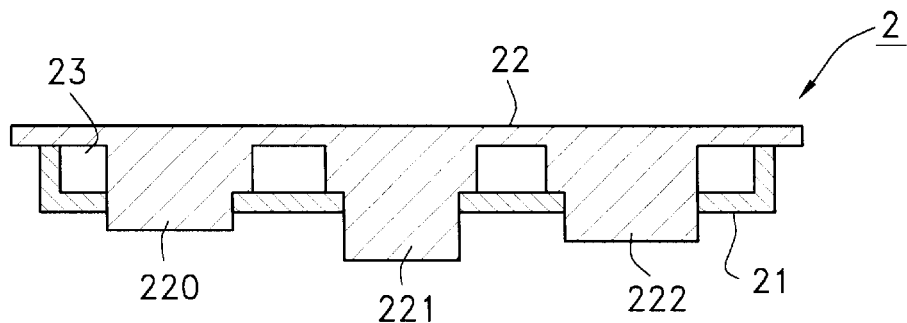
FIG. 2 is a schematic cross sectional view of other embodiment of a plate type heat pipe of the present invention.

FIG. 2 is a schematic cross sectional view of other embodiment of a plate type heat pipe of the present invention. The plate type heat pipe is formed by joining the upper plate member 22 having the blocks 220 to 222 to the lower plate member 21. More specifically, the lower portion of the blocks which are integrally formed as one piece together with the upper plate member pass through the opening portion formed in the lower plate member and protrude downward. The upper plate member having the blocks 220 to 222 integrally formed are joined to the lower plate member 21 to form the hermetically sealed hollow portion 23. Working fluid (not shown) is received in the hollow portion 23. Wick or the like (not shown) to perform a capillary action may be arranged within the hollow portion 23. The blocks 220 to 222 are made of solid material having excellent heat transfer property.

According to the above-mentioned embodiment of the plate type heat pipe, in comparison with the embodiment as shown in FIG. 1, there is no need to separately prepare the blocks, thus reducing the number of the parts and lowering the cost of fabricating the plate type heat pipe. In addition, the blocks 220 to 222 may be integrally formed as one piece together not with the upper plate member 22, but with the lower plate member 21. In this embodiment of the plate type heat pipe 2, the parts to be cooled (not shown) are caused to contact with the lower surfaces of the blocks 220 to 222. Heat generated by the heat generating part which is contacted with the lower surface of the block is rapidly transferred through the block having excellent heat transfer property to the side of the upper plate member. Furthermore, the heat transferred to the block causes the working fluid received in the hollow portion to be vaporized and flowed to the side of the upper plate member according to the function of the heat pipe.

Figure 3:
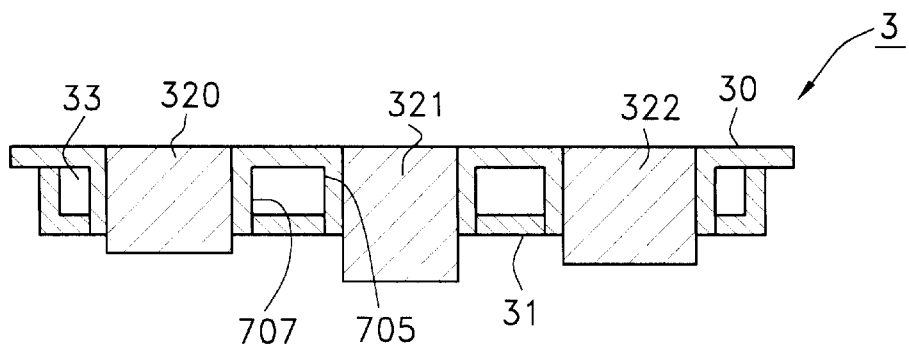
FIG. 3 is a schematic cross sectional view of other embodiment of a plate type heat pipe of the present invention.

FIG. 3 shows a cross sectional view of another embodiment of the plate type heat pipe. Although the embodiment shown in FIG. 3 resembles the embodiment shown in FIG. 1, the blocks 320 to 322 do not contact with the hollow portion 33 in the plate type heat pipe 3. More specifically, the side surfaces 705 of the block 320 to 322 do not form the part of the inner wall defining (i.e., forming) the hermetically sealed hollow portion 33. There are arranged blocks 320 to 322 which pass through both of main surfaces (i.e., upper and lower surfaces in the drawing) formed by an upper plate member 30 and a lower plate member 31 in a plate type heat pipe 3. More specifically, through holes are formed in the plate type heat pipe, which run through the plate type heat pipe and the respective peripheral surface of the through holes are formed by wall member 707. More specifically, the peripheral surfaces of the through holes are formed by the wall member integrally formed together with the upper plate member. Accordingly, the plate type heat pipe of this embodiment includes a hollow portion hermetically sealed by the upper plate member, wall member and the lower plate member. The blocks are arranged to be fitted into the respective through hole running from the upper plate member to the lower plate member in close contact in such manner that the upper surface of the plate member is positioned in the same plane to the respective upper surfaces of the blocks as shown in FIG. 3. The lower end of the blocks pass through the lower plate member and protrude downward a prescribed length. The above-mentioned length is decided in corresponding to the height of the part to be cooled mounted on a printed board.

According to the embodiment as shown in FIG. 3, since the blocks 320 to 322 are separately prepared from the portion forming the upper plate member, the lower plate member and the wall member which form the hollow portion 33, which are different materials each other, the hollow portion may be easily kept hermetically sealed during the working, when the upper plate member is joined to the lower plate member and the blocks are joined to the upper plate member and the lower plate member, thus favorable in fabrication. Furthermore, since the blocks do not contact with the working fluid to result in no affection each other, the scope in which the material of the blocks are selected may be expanded, thus favorable. In this embodiment of the plate type heat pipe 3, the parts to be cooled (not shown) are caused to contact with the lower surfaces of the blocks 320 to 322 in the same manner as described in the above-mentioned embodiment. Heat generated by the heat generating part is transferred in the same manner as described in the above-mentioned embodiment.

Figure 4:
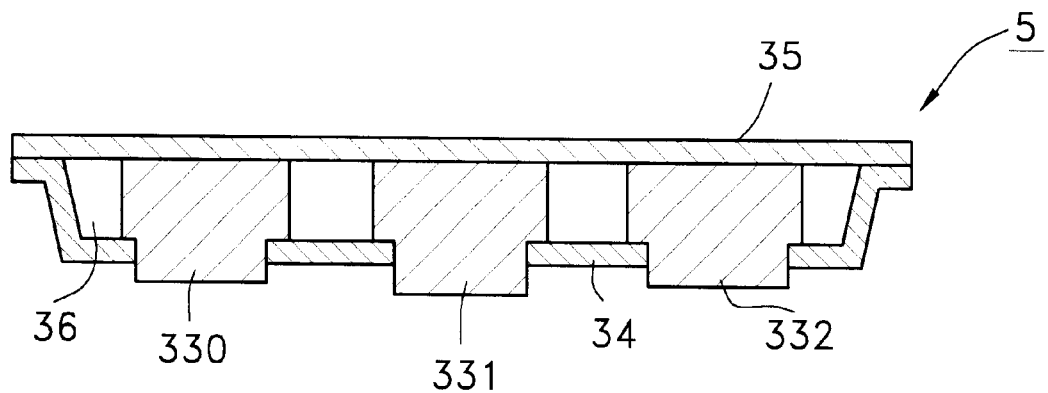
FIG. 4 is a schematic cross sectional view of other embodiment of a plate type heat pipe of the present invention.

FIG. 4 shows a cross-sectional view of the embodiment of the plate type heat pipe in which the blocks 330 to 332 pass through only one main surface (i.e., plate member) of the plate type heat pipe 5. In the embodiment as shown in FIG. 4, the upper plate member 35 is joined to the upper ends of the respective blocks 320 to 322. Opening portions are formed in the lower plate member 34. The respective lower portions of the blocks pass through the openings end extend downward. Thus, the hermetically sealed hollow portion 36 is formed by the upper plate member 35, the lower plate member 34, and the blocks 330 to 332.

Whether the block or blocks pass through both main surfaces or only one main surface is decided depending on a required configuration (i.e., shape), size preciseness, and fabrication cost or the like. When the blocks pass through the main surface of the plate type heat pipe to which the parts to be cooled are connected, the flatness in the highest heat flux (heat density) may be improved to result in reducing contact resistance, thus obtaining high cooling efficiency. The opposite main surface to the main surface to which parts to be cooled are connected is a heat dissipating surface. Since the heat flux in the heat dissipating surface is small, the flatness of the heat dissipating surface does not have a critical effect in some case. In those case, the blocks do not necessarily pass through the main surface in the heat dissipating side of the plate type heat pipe.

Figure 5:
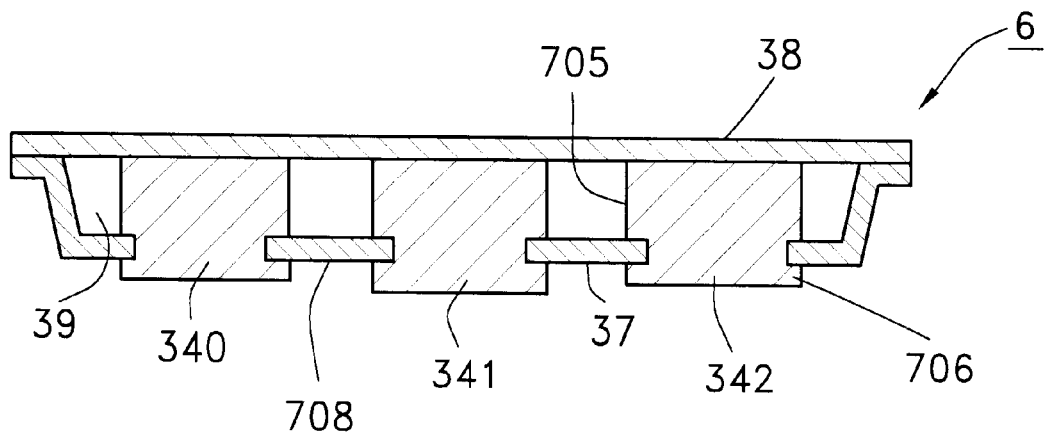
FIG. 5 is a schematic cross sectional view of other embodiment of a plate type heat pipe of the present invention.

FIG. 5 shows a cross-sectional view of other embodiment of the plate type heat pipe in which the blocks 340 to 342 pass through only one main surface (i.e., plate member) of the plate type heat pipe 6. The embodiment resembles the embodiment shown in FIG. 5, but differs from the embodiment in the shape of the portions of the blocks which pass through the lower plate member and extend downward. More specifically, the upper plate member 38 is joined to the upper ends of the respective blocks 340 to 342. Opening portions are formed in the lower plate member 37. The respective lower portions 706 of the blocks pass through the openings and extend downward and further sideward along the outer surface 708 of the lower plate member as shown in FIG. 5. Thus, the hermetically sealed hollow portion 39 is formed by the upper plate member 38, the lower plate member 37, and the blocks 340 to 342. Whether the block or blocks pass through both main surfaces or only one main surface is decided depending on a required configuration (i.e., shape), size preciseness, and joining process appropriate to the material or the like.

In the plate type heat pipe of the present invention, since the blocks are arranged to pass through at least one main surface of the heat pipe to which the parts to be cooled connected, higher size preciseness in the distance between the parts to be cooled and the lower end of the blocks can be easily implemented. When the blocks are formed by forging or precision casting, the cost of the blocks can be reduced lower. Cutting may be applied to a case in which a very high preciseness in size is required.

Figure 11:
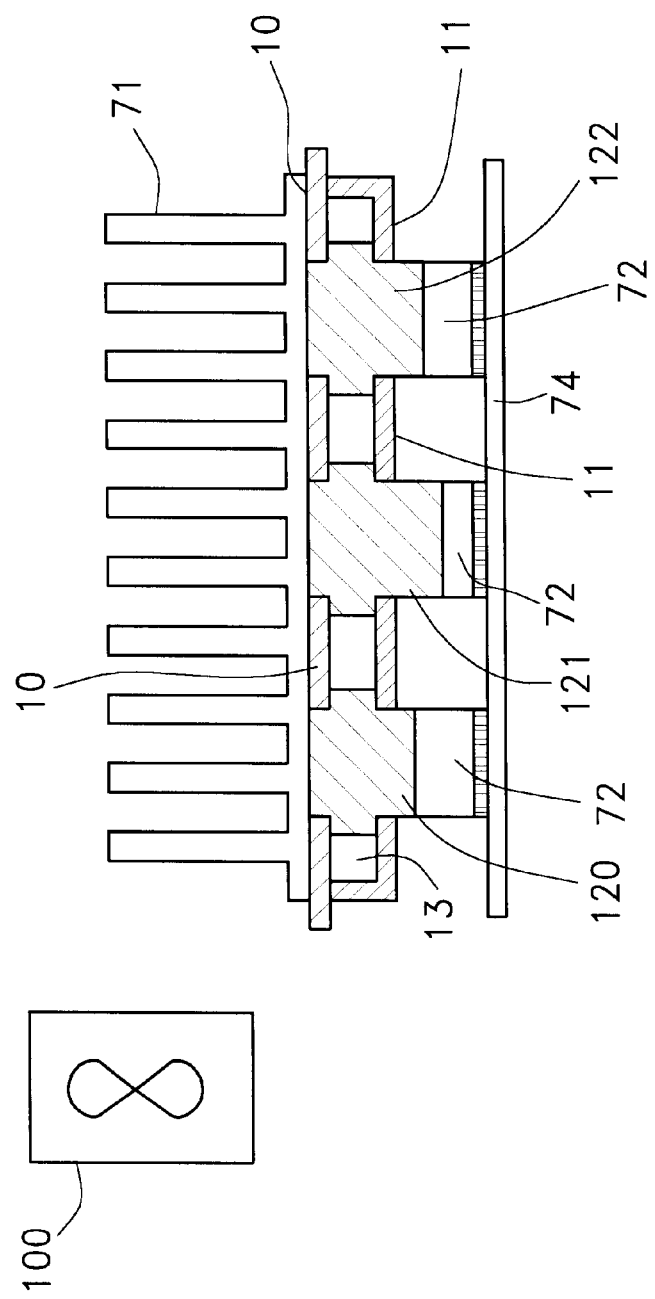
FIG. 11 is a schematic cross-sectional view showing a plate type heat pipe of the present invention and a cooling system using the same.

In a cooling system using the above-mentioned plate type heat pipe of the present invention, in case to cool the semiconductor parts mounted on a printed board, the plate type heat pipe is arranged so as to face the printed board in such manner that the semiconductor parts are thermally connected to one main surface of the plate type heat pipe, and a heat sink is joined to the other one main surface of the plate type heat pipe. In addition, a fan to supply air toward the heat sink may be further attached to the plate type heat pipe to improve cooling efficiency, if necessary. (FIG. 11)

The plate type heat pipe of the present invention is further described by the example.

EXAMPLE

Figure 6:
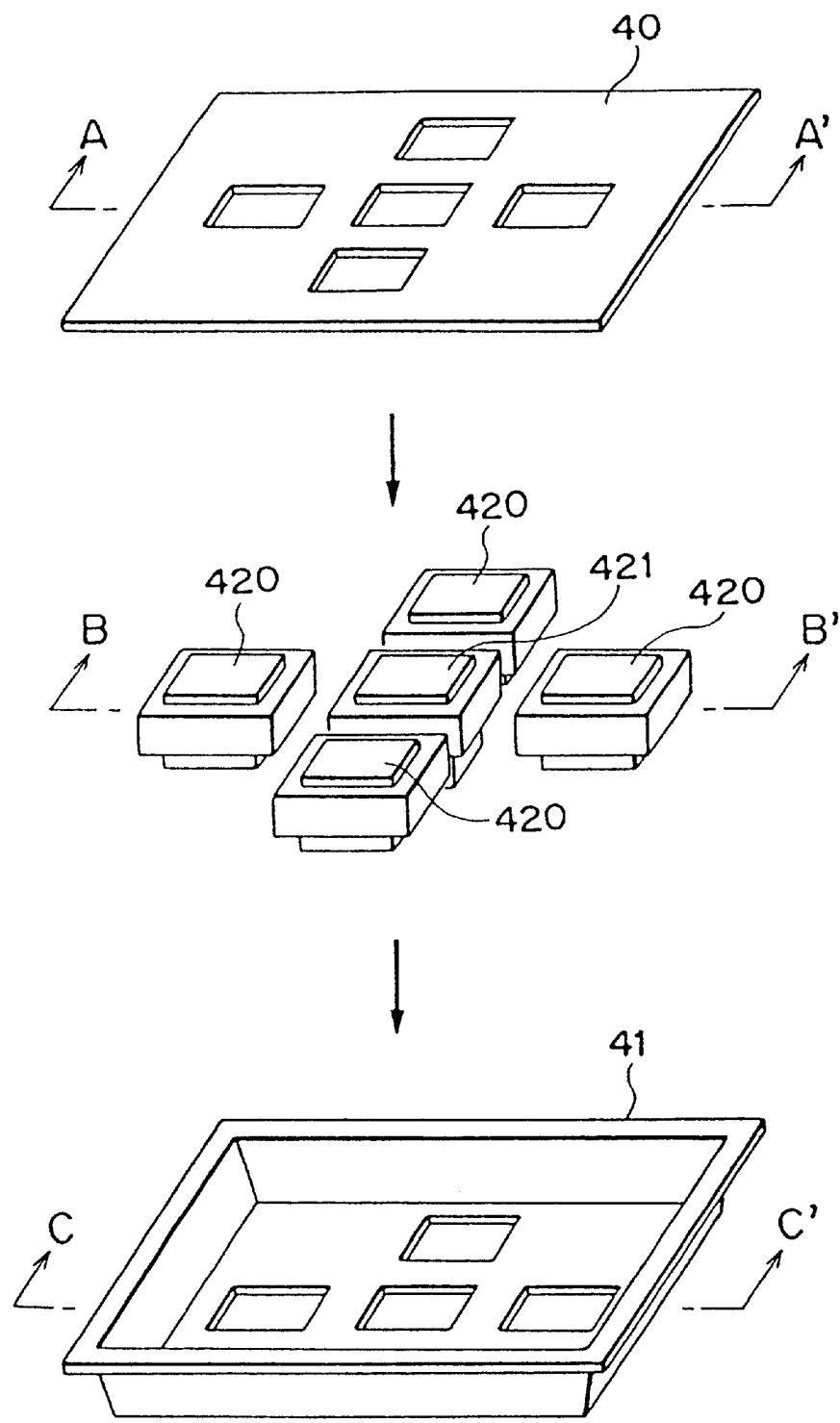
FIG. 6 is a descriptive view to show a situation of fabricating one embodiment of a plate type heat pipe of the present invention.
Figure 7A:
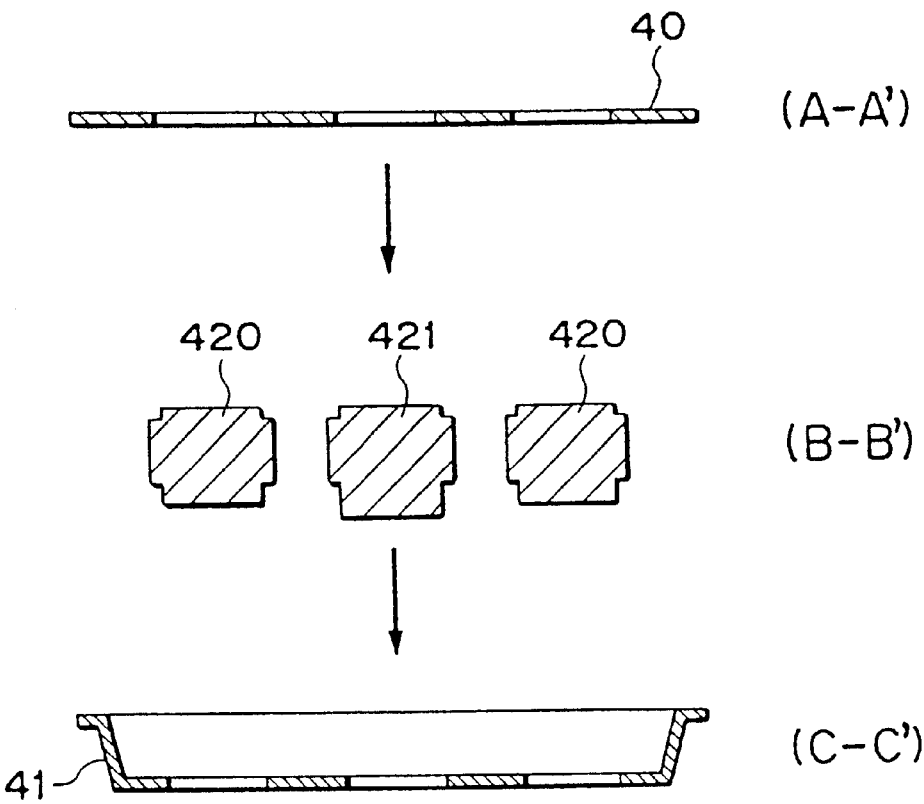
FIG. 7(a) is a cross-sectional view showing respective cross sectional views along A–A' line, B–B' line and C–C' line.
Figure 7B:
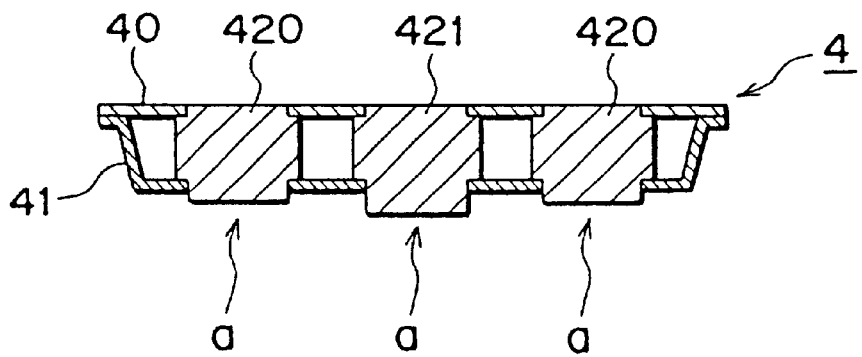
FIG. 7(b) is a cross-sectional view of the fabricated plate type heat pipe.

FIG. 6 is a descriptive view to show a fabricating process of one embodiment of a plate type heat pipe of the present invention. FIG. 7(a) is a cross-sectional view showing respective cross sectional views along A–A' line, B–B' line and C–C' line. FIG. 7(b) is a cross-sectional view of the fabricated plate type heat pipe. Reference numerals 40, 41 show the upper plate member and the lower plate member, respectively. Reference numerals 420, 421 show block. In this example, four blocks 420 and one block 421 are used. The numbers, the location, and the size of the block may be decided considering the feature of the parts to be cooled. In both of the upper plate member and the lower plate member, opening portions are formed in such manner that each upper end and lower end of the blocks 420, 421 are inserted, and closely fitted thereto.

The upper plate member 40, the lower plate member 41, the blocks 420, 421 are made of oxygen-free copper. The blocks 420, 421 are formed by cutting. The upper plate member 40 and the lower plate member 41 are formed by press working. The hermetically sealed container of the plate type heat pipe 4 was fabricated by vacuum-soldering the upper plate member 40, the lower plate member 41, and the blocks 420, 421 in use of a silver soldering (Bg-8). In the thus fabricated plate type heat pipe, the upper surface of the upper plate member and the upper surface of the blocks are positioned in the same plane, and the lower portion of the blocks protrude downward for prescribed lengths (which correspond to the respective heights of the parts to be cooled), as shown in FIG. 7(b). The parts to be cooled are closely connected to the respective surfaces of the lower ends of the blocks.

Metal mesh (not shown) was arranged within the hollow portion. The air within the hollow portion of the plate type heat pipe 4 was removed to be vacuum so as to reduce the inner pressure thereof, and then pure water in an amount of about 30% of the volume of the hollow portion was received, and the container of the plate type heat pipe was hermetically sealed, thus fabricating the heat pipe.

Figure 8A:
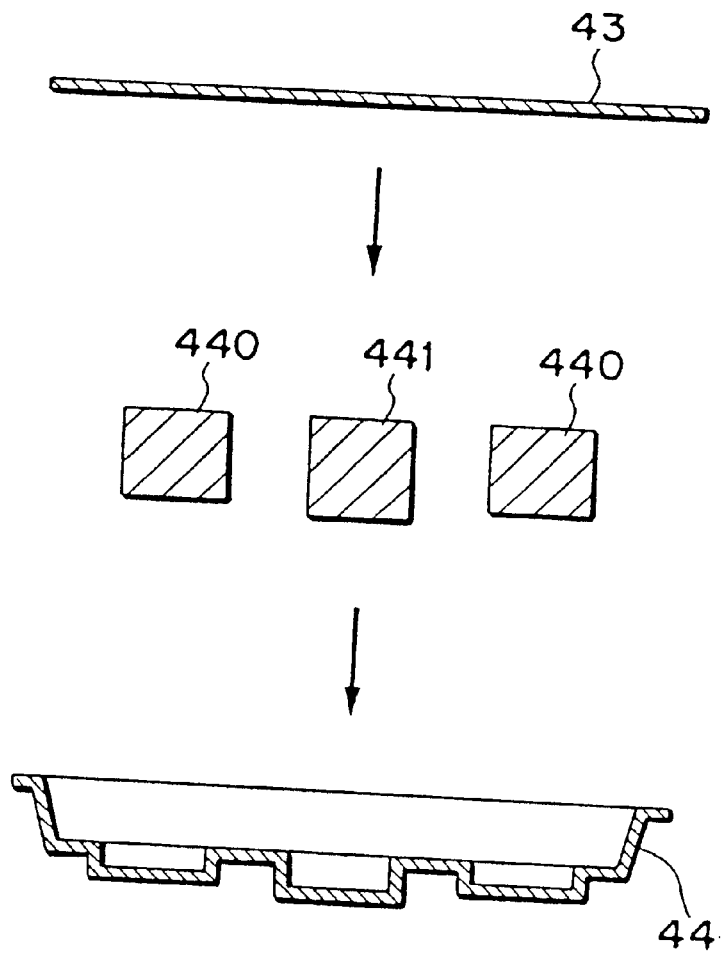
FIG. 8(a) is a cross-sectional view showing respective components of the plate type heat pipe for comparison.
Figure 8B:
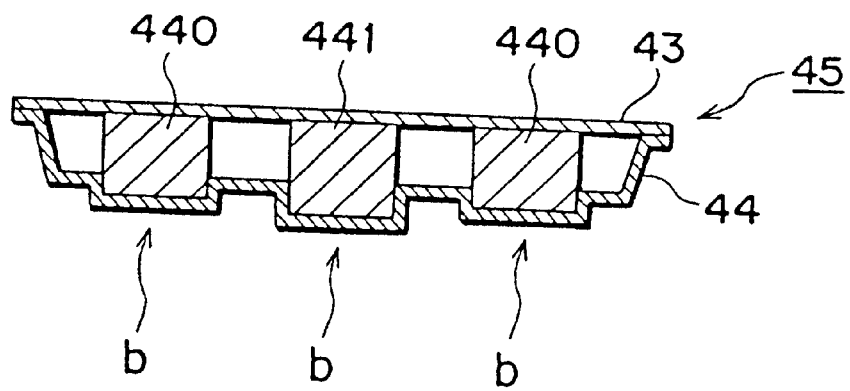
FIG. 8(b) is a cross-sectional view of the fabricated plate type heat pipe for comparison.
Figure 9:
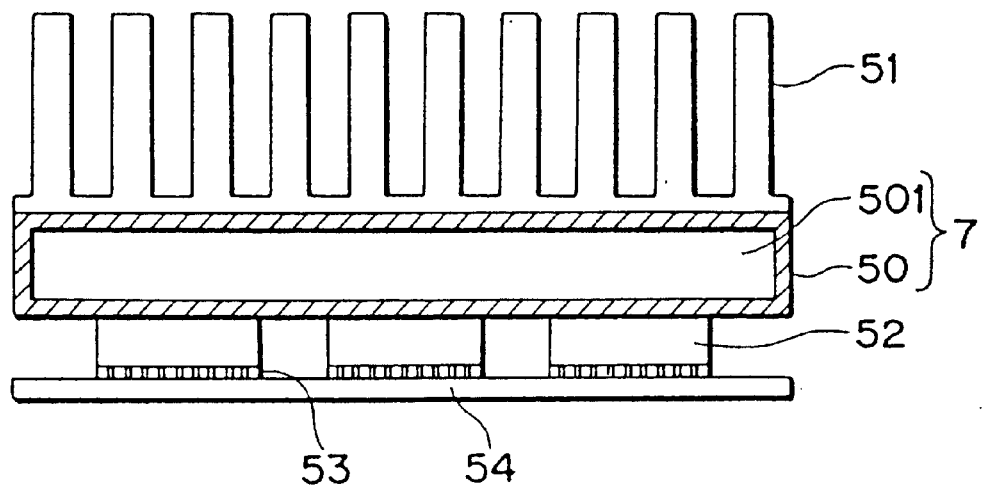
FIG. 9 is a schematic cross sectional view showing a conventional plate type heat pipe and a cooling system using same.
Figure 10:
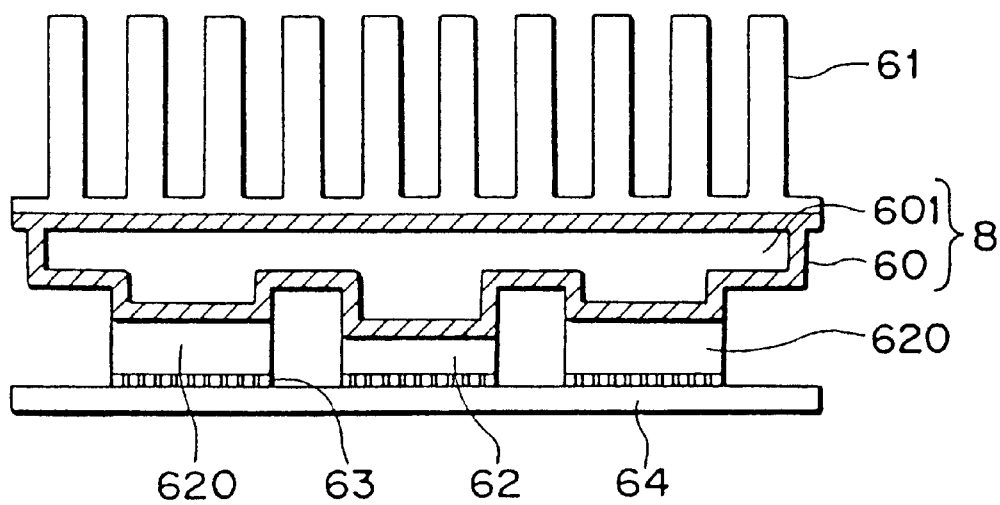
FIG. 10 is a schematic cross sectional view showing a conventional plate type heat pipe and a cooling system using same.

For comparison, the plate type heat pipe 45 was fabricated as shown in FIG. 8. More specifically, the blocks 440, 441 do not pass through any one of the main surfaces of the plate type heat pipe 45. Reference numerals 43, 44 show the upper plate member, the lower plate member, respectively.

Flatness in the contact surface between the outer surface of the plate type heat pipe and the parts to be cooled (i.e., the surface as shown by reference numerals a, b in FIGS. 7 and 8) were investigated in the stages of before soldering, after soldering and after completion of fabricating heat pipe in the fabricating process. The flatness were obtained by measuring 25 heights of the protruded portions (i.e., portions designated by reference numerals a, b which have five 20mm ×20mm square areas, respectively) by means of a height gage, and then calculating mean value ($\square$(delta) h) of differences between the maximum value and the minimum value thereof. The result thereof is shown in Table 1.

TABLE 1

|  | before soldering | after soldering | after completion of the heat pipe |
|---|---|---|---|
| $\square$h(mm) in the present invention | <0.01 | <0.01 | <0.01 |
| $\square$h(mm) in the comparison | <0.01 | 0.04 | 0.06 |

As is clear from Table 1, in the plate type heat pipe 4 of the present invention, high flatness in the contact surface between the parts to be cooled and the plate type heat pipe can be attained either in the stage after soldering or after completion of fabricating heat pipe. Accordingly, the plate type heat pipe of the present invention can be connected to the parts to be cooled in a lower heat resistance, and it is clear that according to the present invention, excellent cooling efficiency can be practically obtained. Although the detail is not shown, the plate type heat pipe 4 of the present invention and the plate type heat pipe 45 for comparison had the same heat efficiency except heat resistance in the contact surface between the parts to be cooled and the heat pipe thereof.

According to the present invention, a plate type heat pipe which may contact with the heat generating parts to be cooled in least resistance and enable effective cooling of the heat generating parts, and the cooling system using same may be provided.

What is claimed is:

1. A plate type heat pipe having a hermetically sealed container installed so as to face a printed board on which at least one part to be cooled is mounted, wherein at least one block passes through an opening formed in at least one main plate member of said container.

2. The plate type heat pipe as claimed in claim 1, wherein said block passes through said main plate member which faces said part to be cooled.

3. The plate type heat pipe as claimed in claim 1, wherein a lower portion of said block which passes through said main plate member extending along outer surface of said main plate member.

4. The plate type heat pipe as claimed in claim 1, wherein said block is integrally formed as one piece together with one of said main plate member by a same material.

5. A plate type heat pipe having a hermetically sealed container installed so as to face a printed board on which at least one part to be cooled is mounted, wherein at least one block which passes through opening portion formed in at least one main plate member of said container is arranged within said container in a corresponding portion to said part to be cooled, and a wall member is formed in a portion corresponding to side surface of said block within a hollow portion of said container in such manner that said container is hermetically sealed and said block is separated from a working liquid received in said container.

6. The plate type heat pipe as claimed in claim 2, wherein said block is integrally formed as one piece together with one of said main plate member by a same material.

7. The plate type heat pipe as claimed in claim 3, wherein said block is integrally formed as one piece together with one of said main plate member by a same material.

8. A plate type heat pipe having a hermetically sealed container including an upper plate member and a lower plate member installed so as to face a printed board on which at least one part to be cooled is mounted, wherein an opening portion is formed in said lower plate member, and at least one block is arranged within said container in such manner that one end of said block is joined on inner surface of said upper plate member, and other end of said block passes through said opening portion and extends to a prescribed length toward said part to be cooled.

9. A plate type heat pipe having a hermetically sealed container including an upper plate member and a lower plate member installed so as to face a printed board on which at least one part to be cooled is mounted, wherein an opening portion is formed in said lower plate member which faces said part to be cooled, another opening portion is formed in said upper plate member, and at least one block is arranged within said container in such manner that one end of said block passes through said another opening portion in said upper plate member so as to form a same plane together with outer surface of said upper plate member, and other end of said block passes through said opening portion and extends to a prescribed length toward said part to be cooled.

10. A plate type heat pipe having a hermetically sealed container including an upper plate member and a lower plate member installed so as to face a printed board on which at least one part to be cooled is mounted, wherein at least one through hole is formed from said upper plate member to said lower plate member, side surface of said through hole is defined by wall member so as for said container to be hermetically sealed, and a block is arranged in close contact within respective said through hole in such manner that one end of said block forms a same plane together with outer surface of said upper plate member, and other end of said block extends from outer surface of said lower plate member to a prescribed length toward said part to be cooled.

11. A plate type heat pipe having a hermetically sealed container installed so as to face a printed board on which at least one part to be cooled is mounted, wherein at least one block which passes through opening portion formed in at least one main plate member of said container is arranged within said container in a corresponding portion to said part to be cooled, said block passes through said main plate member which faces said part to be cooled, and a wall member is formed in a portion corresponding to side surface of said block within a hollow portion of said container in such manner that said container is hermetically sealed and said block is separated from a working liquid received in said container.

12. A plate type heat pipe having a hermetically sealed container installed so as to face a printed board on which at least one part to be cooled is mounted, wherein at least one block which passes through opening portion formed in at least one main plate member of said container is arranged within said container in a corresponding portion to said part to be cooled, a lower portion of said block which passes through said main plate member extends along outer surface of said main plate member, and a wall member is formed in a portion corresponding to side surface of said block within a hollow portion of said container in such manner that said container is hermetically sealed and said block is separated from a working liquid received in said container.

13. A plate type heat pipe having a hermetically sealed container installed so as to face a printed board on which at least one part to be cooled is mounted, wherein at least one block which passes through opening portion formed in at least one main plate member of said container is arranged within said container in a corresponding portion to said part to be cooled, said block is integrally formed as one piece together with one of said main plate member by a same material, and a wall member is formed in a portion corresponding to side surface of said block within a hollow portion of said container in such manner that said container is hermetically sealed and said block is separated from a working liquid received in said container.

14. A cooling system using a plate type heat pipe having a hermetically sealed container installed so as to face a printed board on which at least one part to be cooled is mounted, said part to be cooled being connected to said plate type heat pipe, and heat dissipating fins joined on said plate type heat pipe, wherein at least one block which passes through opening portion formed in at least one main plate member of said container is arranged within said container in a corresponding portion to said part to be cooled, and a wall portion is formed in a portion corresponding to side surface of said block within a hollow portion of said container in such manner that said container is hermetically sealed and said block is separated from a working liquid received in said container.

15. A cooling system as claimed in claim 14, wherein said block which passes through said main plate member which faces said part to be cooled.

16. A cooling system as claimed in claim 14, wherein a tip portion of said block which passes through said main plate member extends along outer surface of said main plate member.

17. A cooling system as claimed in claim 14, wherein said block is integrally formed as one piece together with one of said main plate member by a same material.

18. A cooling system as claimed in claim 14, wherein a fan to supply air to said heat dissipating fins is further included.

* * * * *